US006781195B2

United States Patent
Wu et al.

(10) Patent No.: US 6,781,195 B2
(45) Date of Patent: Aug. 24, 2004

(54) SEMICONDUCTOR BIDIRECTIONAL SWITCHING DEVICE AND METHOD

(75) Inventors: Yujing Wu, Chandler, AZ (US); Jeffrey Pearse, Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 162 days.

(21) Appl. No.: 09/766,966

(22) Filed: Jan. 23, 2001

(65) Prior Publication Data

US 2002/0096709 A1 Jul. 25, 2002

(51) Int. Cl.[7] .......................... H01L 29/76; H01L 29/94; H01L 31/062; H01L 31/113
(52) U.S. Cl. ...................... 257/329; 257/330; 257/331; 257/341
(58) Field of Search ................. 257/329, 330, 257/331, 341

(56) References Cited

U.S. PATENT DOCUMENTS 6,278,155 B1 * 8/2001 Okabe et al. ............... 257/329
6,307,755 B1 * 10/2001 Williams et al. ............ 257/666

FOREIGN PATENT DOCUMENTS

JP         60-28271    *  2/1985  .................. 257/329

* cited by examiner

Primary Examiner—Steven Loke
(74) Attorney, Agent, or Firm—James J. Stipanuk (57) ABSTRACT

A semiconductor switching device (10) is formed on a semiconductor substrate (12) having a trench (44) formed on one of its surfaces (42). A control electrode (32) activates a wall of the trench to form a conduction channel (36). A first conduction electrode (40) is disposed on the semiconductor substrate to have a first doped region (34) for receiving a current and a second doped region (24) for routing the current to the conduction channel.

16 Claims, 7 Drawing Sheets

SEMICONDUCTOR BIDIRECTIONAL SWITCHING DEVICE AND METHOD

FIELD OF THE INVENTION

The present invention relates in general to semiconductor devices and, more particularly, to high current, high voltage bidirectional switching devices.

BACKGROUND OF THE INVENTION

Bidirectional switches are power devices that switch high currents through their conduction electrodes while blocking high voltages applied to the conduction electrodes. Bidirectional switches are used in a variety of electrical systems. For example, battery chargers often use a bidirectional switch to control a current flowing between a terminal of the charger to a terminal of a battery being charged. A control voltage is applied to a control electrode of the bidirectional switch to close the switch and allow current to flow from the charger terminal to the battery terminal to charge the battery. When the control voltage is removed, the bidirectional switch opens and no current flows. If the charger is turned off while the battery is attached, the switch blocks the voltage on the battery terminal, and if the battery is removed while the charger is turned on, the switch blocks the voltage on the charger terminal. A typical bidirectional switch is specified to supply at least one ampere of current while blocking voltages of at least eight volts without breaking down.

Standard planar power metal-oxide-semiconductor field effect transistors (MOSFET) are not adequate for use as bidirectional switches because they have low gate to source breakdowns, often as low as five volts, and have a low current capability due to low packing density for a given breakdown voltage. Standard vertical power MOSFETs also are not adequate because of a low breakdown in one direction, making them unidirectional devices. Consequently, current bidirectional switches typically are implemented using two separate serially coupled power MOSFETs, with the drain of each transistor operating as a conduction electrode of the switch. The separate MOSFETs are formed on separate semiconductor dice and housed in separate packages, which results in a high manufacturing cost and a large area occupied on a circuit board. When the separate MOSFET dice are housed in a single package and interconnected with wire bonds, the area occupied on a circuit board is reduced but the manufacturing cost is still too high for many applications.

Hence, it would be a benefit if there were a bidirectional switch that was manufactured on a single semiconductor die in order to reduce the manufacturing cost of the bidirectional switch.

DETAILED DESCRIPTION OF THE DRAWINGS

In the figures, elements having the same reference numbers have similar functionality.

Figure 1:
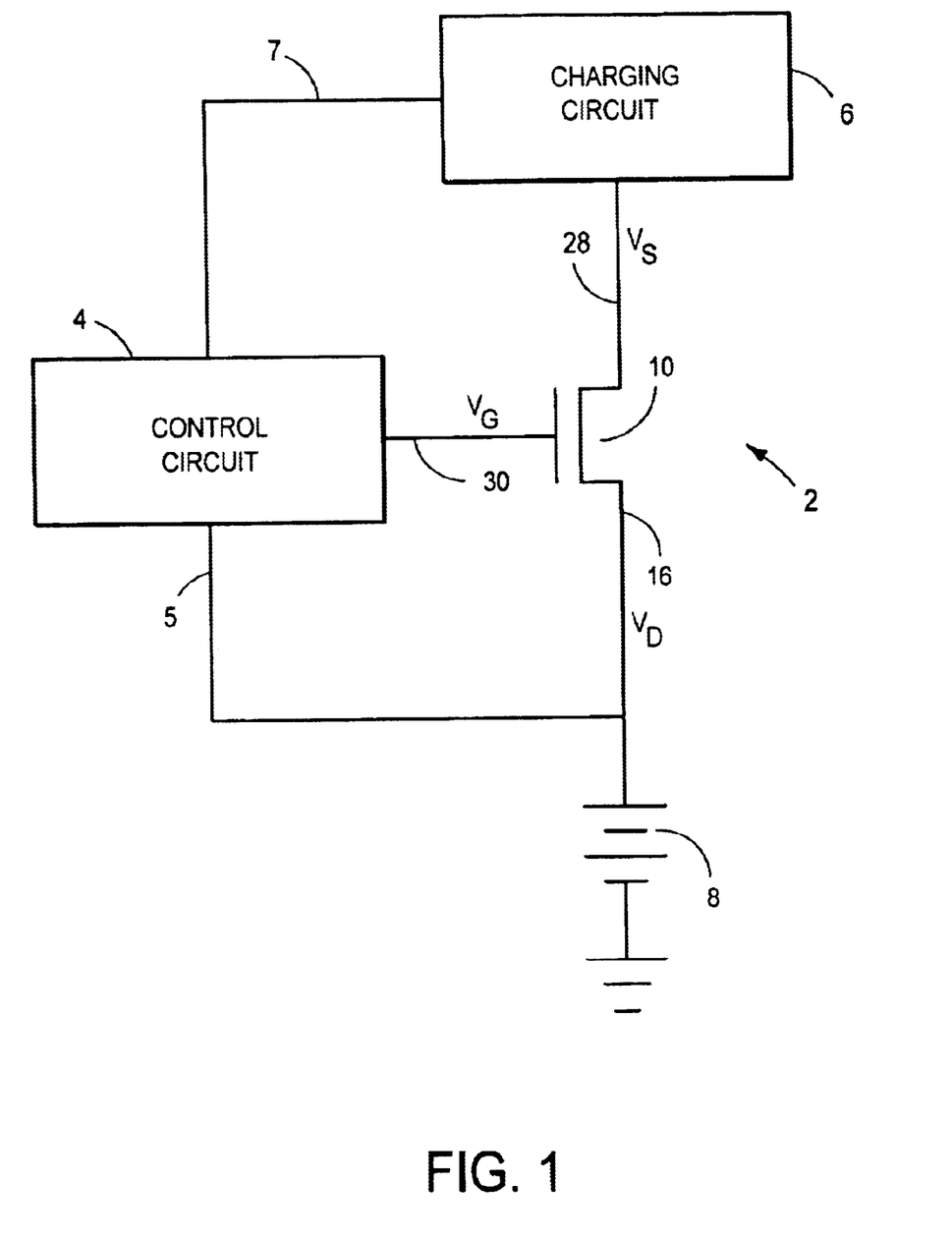
FIG. 1 is a schematic diagram of a battery charger charging a battery.

FIG. 1 is a schematic diagram of a battery charger 2 for charging a battery 8. Battery charger 2 includes a control circuit 4, a charging circuit 6 and a bidirectional switch 10. In one embodiment, battery 8 is configured as an eight volt battery.

Control circuit 4 has a sense input 5 for monitoring a voltage VD across battery 8. Voltage $V_D$ is processed and the charge status is provided on a status output coupled to a node 7 and received by charging circuit 6 for generating an appropriate charging voltage $V_S$=8.0. A control output applies a voltage $V_G$=3.0 volts to a control or gate lead 30 of bidirectional switch 10, which routes a charging current from charging circuit 6 to battery 8 during normal operation. If a fault condition such as a shorted battery or charging malfunction occurs, control circuit 4 sets $V_G$ to zero volts to turn off bidirectional switch 10 to isolate charging circuit 6 from battery 8.

Bidirectional switch 10 has first and second current carrying package leads designated as a source lead 28 and a drain lead 16, which operate at voltages $V_S$ and $V_D$, respectively. When $V_G$ is zero volts, voltage on both source lead 28 and drain lead 16 is blocked, thereby avoiding a current flow from either charging circuit 6 or battery 8 that could result in damage. In one embodiment, bidirectional switch 10 is specified to operate with a current flow of at least one ampere when turned on, and to block a voltage of at least eight volts applied between drain lead 16 and source lead 28 or between gate lead 30 and either source lead 28 or drain lead 16 when turned off.

Figure 2:
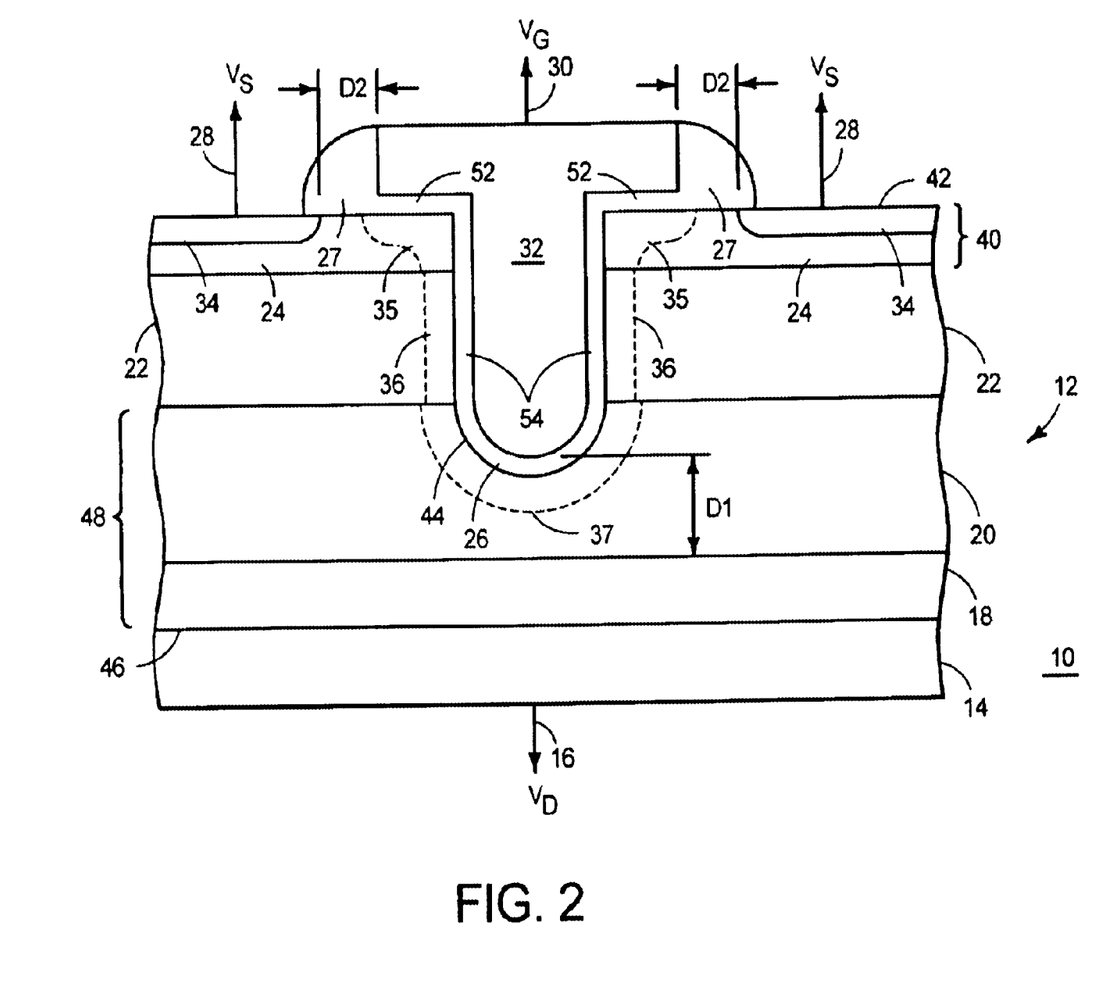
FIG. 2 shows a cross-sectional view of a bidirectional switch in a first embodiment.

FIG. 2 is a cross-sectional view of bidirectional switch 10 formed in a semiconductor substrate 12 for switching a current between drain lead 16 and a source lead 28 in response to voltage $V_G$ applied to gate lead 30.

Semiconductor substrate 12 has a first surface 42 which is selectively etched to a depth of about 2.7 micrometers to form a trench 44. Semiconductor substrate 12 has a second surface 46 for mounting to a die attach flag 14 of a semiconductor device package. Die attach flag 14 is formed with a metal or other highly conductive material and coupled to drain lead 16 to provide a low resistance current path. Semiconductor substrate 12 is layered by successive doping steps to produce doped regions designated as a drain 18, a drain extension 20, a body region 22 and a source extension 24.

Drain 18 and drain extension 20 cooperate to function as a drain electrode 48. Drain 18 is formed adjacent to second surface 46 and is heavily doped with donor atoms to produce a low resistivity region of n-type conductivity and to provide an ohmic contact to die attach flag 14.

Drain extension 20 extends upward from drain 18 to a depth of about 2.2 micrometers from first surface 42, which is about 0.5 micrometers above the bottom of trench 44. Drain extension 20 is doped with donor atoms to produce a material with n-type conductivity but with a lower doping concentration than drain 18. The thickness of drain extension 20 is selected to provide a blocking or breakdown voltage from drain lead 16 to either source lead 28 or gate lead 30 of at least eight volts as described below. In one embodiment, drain extension 20 has a thickness of about two micrometers and a doping concentration of about $5*10^{15}$ atoms/centimeter$^3$.

Body region 22 is lightly doped with acceptor atoms to produce a material with p-type conductivity which can be inverted to activate a conduction channel 36 when a control voltage exceeds a conduction threshold of bidirectional switch 10. In one embodiment, a gate lead 30 to source lead 28 conduction threshold is 1.5 volts and a gate lead 30 to drain lead 16 conduction threshold is 1.5 volts. Body region 22 has a thickness of about 1.2 micrometers and a doping concentration of about $5*10^{15}$ atoms/centimeter$^3$.

Source extension 24 is formed adjacent to first surface 42 and is doped with donor atoms to produce a material with n-type conductivity. The thickness and doping concentration are selected to provide a desired blocking or breakdown voltage greater than eight volts from source lead 28 to either drain lead 16 or gate lead 30. In one embodiment, source extension region is formed with a thickness of about 0.9 micrometers and a doping concentration of about $1.8*10^{17}$ atoms/centimeter$^3$. Note that the embodiment of FIG. 1 shows separate regions designated as source extension 24. Depending on the specified current capability, bidirectional switch 10 may include a multiplicity of such commonly designated regions, which are coupled together out of the view plane of FIG. 1 to function as a single region. Such features are not shown in order to more clearly show and describe the invention.

Source 34 is formed adjacent to source extension 24 by selectively introducing donor atoms from surface 42 to a typical depth of about 0.4 micrometers to provide n-type conductivity. The doping concentration is high in order to provide an ohmic contact from source 34 to source lead 28. In one embodiment, source 34 has a doping concentration of $3.0*10^{19}$ atoms/centimeter$^3$.

A dielectric layer 26 includes a region 52 overlying first surface 42, a region 54 adjacent to walls of trench 44, and a spacer 27 adjacent to a gate electrode 32. In one embodiment, dielectric layer 26 comprises silicon dioxide. The thickness of dielectric layer 26 in regions 52 and 54 is similar, and consequently such regions typically are formed during the same processing step. Dielectric layer 26 is made sufficiently thin in region 54 to function as a gate dielectric for bidirectional switch 10. Hence, if a source voltage $V_S$ operating at ground potential is applied to source lead 30 while a positive gate voltage $V_G$ greater than the conduction threshold is applied to gate lead 30, body region 22 is inverted adjacent to region 54 to form conduction channel 36 between source extension 24 and drain extension 20. Similarly, if drain lead 16 operates at a drain voltage $V_D$=0.0 volts while a positive voltage $V_G$ greater than the conduction threshold is applied to gate lead 30, body region 22 inverts to form conduction channel 36 adjacent to region 54. In one embodiment, regions 52 and 54 have a thickness of about two hundred angstroms, so a voltage greater than a critical voltage of five volts across regions 52 and/or 54 may result in an undesirable breakdown of dielectric layer 26. If not avoided, such a breakdown would allow current to flow from gate lead 30 to either drain lead 16 or source lead 28 and could result in permanent device damage.

Gate electrode 32 is formed adjacent to dielectric region 54 and extends above first surface 42 to overlie dielectric region 52. Gate electrode 32 typically comprises doped polysilicon to provide a low interconnect resistance and an ohmic contact to gate lead 30.

Spacer 27 is used to electrically isolate gate electrode 32 from source 34 after metallization. Spacer 27 further cooperates with gate electrode 32 during the formation of source 34 to function as a mask to block the introduction of impurities, thereby defining a distance D2 from gate electrode 32 to an edge of source 34. In one embodiment, spacer 27 is formed so that distance D2 is at least 0.4 micrometers.

The operation of bidirectional switch 10 proceeds as follows. Assume source lead 28 is biased at voltage $V_S$=0.0 volts, gate lead 30 is biased at voltage $V_G$=3.0 volts and drain lead 16 is biased at voltage $V_D$=8.0 volts. Since the gate to source voltage $(V_G-V_S)$ is greater than the conduction threshold of 1.5 volts, body region 22 is inverted to form conduction channel 36. A current flows from source lead 28 to source 34 and is successively routed through source extension 24, conduction channel 36, drain extension 20 and drain contact region 14 to die attach flag 14 and drain lead 16. In short, the current flows from source lead 28 to drain lead 16. To turn off bidirectional switch 10, gate voltage $V_G$ is reduced below the conduction threshold, e.g., to ground potential, so no conduction channel is formed and no current flows.

Similarly, when source lead 28 is biased at voltage $V_S$=8.0 volts, gate lead 30 is biased at voltage $V_G$=3.0 volts and drain lead 16 is biased at voltage $V_D$=0.0 volts, body region 22 is inverted to form conduction channel 36. A current flows from drain lead 16 to drain 18 which is successively routed through drain extension 20, conduction channel 36, source extension 24 and source contact region 42 to source lead 28. To turn off bidirectional switch 10, gate voltage $V_G$ is reduced below the conduction threshold, e.g., to ground potential, so no conduction channel is formed and no current flows.

When bidirectional switch 10 is turned off, high voltages either from drain lead 16 to source lead 28 or from source lead 28 to drain lead 16 are blocked because the source-body diode is effectively connected back-to-back with the drain-body diode. The voltage from source lead 28 to gate lead 30 produces a depletion region 35 in source extension 24 adjacent to dielectric regions 52 and 54 as shown. Because source extension region 24 has a lower doping concentration than source 34, source extension region 24 operates as a drift region that causes a drop of the electric potential across the source extension 24, thereby reducing the voltage across dielectric region 54 to below the breakdown level. Hence, no breakdown occurs. Note in one embodiment, source 34 is formed so that distance D2 from gate electrode 32 is at least 0.4 micrometers, which is sufficient to avoid a breakdown of dielectric layer 26 when eight volts is applied to source electrode 28.

Similarly, when bidirectional switch 10 is turned off, the voltage from drain lead 16 to gate lead 30 causes a depletion region 37 to form in drain extension 20 in the vicinity of dielectric region 54. Drain extension 20 has a lower doping concentration than drain 18, and therefore operates as a drift region that causes a drop of the electric potential across drain extension 20. This voltage drop effectively reduces the voltage across dielectric region 54 to below the breakdown level. Hence, no breakdown occurs. To ensure a sufficient voltage drop, a distance D1 from gate electrode 32 to the bottom of drain extension 20 is made larger than depletion region 37. In one embodiment, distance D1 is approximately 1.5 um to ensure that eight volts applied to drain electrode 16 is effectively blocked and dielectric layer 26 does not break down.

Therefore, bidirectional switch 10 blocks high voltages in both directions, i.e., either on source lead 28 or on drain lead 16. Blocking occurs because source and drain extensions 24 and 20 are formed with doping concentrations and widths sufficient to prevent depletion regions from extending to source 34 and/or drain 18, respectively.

Note that the vertical structure of bidirectional switch 10, where current flows vertically through conduction channel 36, allows bidirectional switch 10 to occupy a smaller area of semiconductor substrate 12 in comparison to planar devices.

Figure 3:
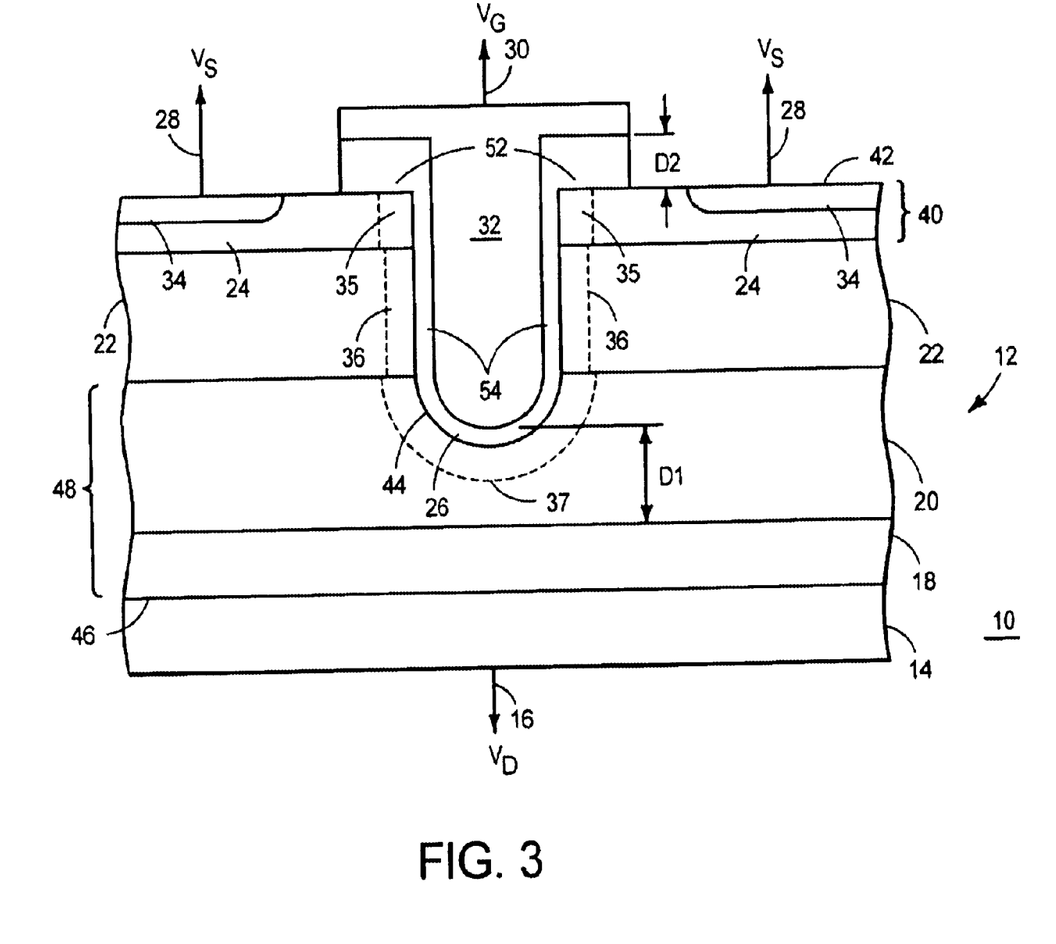
FIG. 3 shows a cross-sectional view of a bidirectional switch in a second embodiment.

FIG. 3 shows bidirectional switch 10 in a second embodiment. Elements described in FIG. 1 have similar structures and operation except that the second embodiment has the advantage that it is not necessary to form a spacer adjacent to gate electrode 32 to maintain a separation from source 34. Instead, region 52 of dielectric layer 26 is formed to a greater thickness than the thickness in region 54. The increased thickness reduces the electric field across region 52 to a value less than a critical breakdown field and maintains distance D2=0.4 micrometers between source 34 and gate electrode 32. In one embodiment, the thickness of dielectric layer 26 in region 52 is four thousand angstroms.

Figure 4:
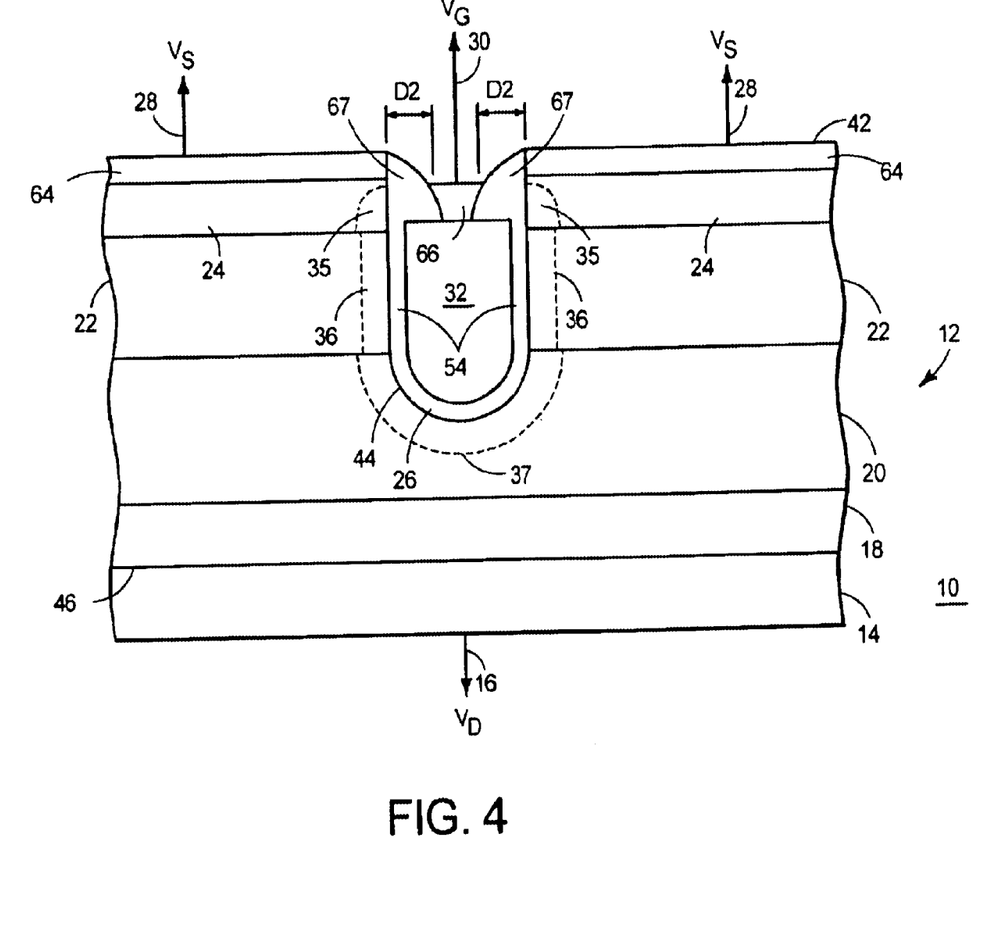
FIG. 4 shows a cross-sectional view of a bidirectional switch in a third embodiment.

FIG. 4 shows bidirectional switch 10 in a third embodiment. Elements previously described have similar structures and functionality except that source 34 is replaced by a source contact layer 64 which is formed to a similar thickness and doping concentration to provide ohmic contact to source lead 28. Source contact layer 64 is formed as a blanket deposition by either diffusion or by an epitaxial growth overlying source extension 24. In one embodiment, source contact layer 64 is formed prior to, and defined by, trench 44. Hence, formation does not require a separate photolithography step.

Gate electrode 32 is formed within trench 44 and below surface 42 a distance adequate to space gate electrode 32 at least 0.4 micrometers from source contact layer 64, thereby avoiding a breakdown at less than the specified voltage. A gate conductor 66 comprising a metal such as aluminum overlies gate electrode 32, with which it has an ohmic contact to reduce resistance. Gate conductor 66 is defined by an insulative spacer 67 to maintain distance D2 at least 0.4 micrometers between gate conductor 66 and source contact layer 64 to prevent a breakdown at less than the specified voltage.

Figure 5:
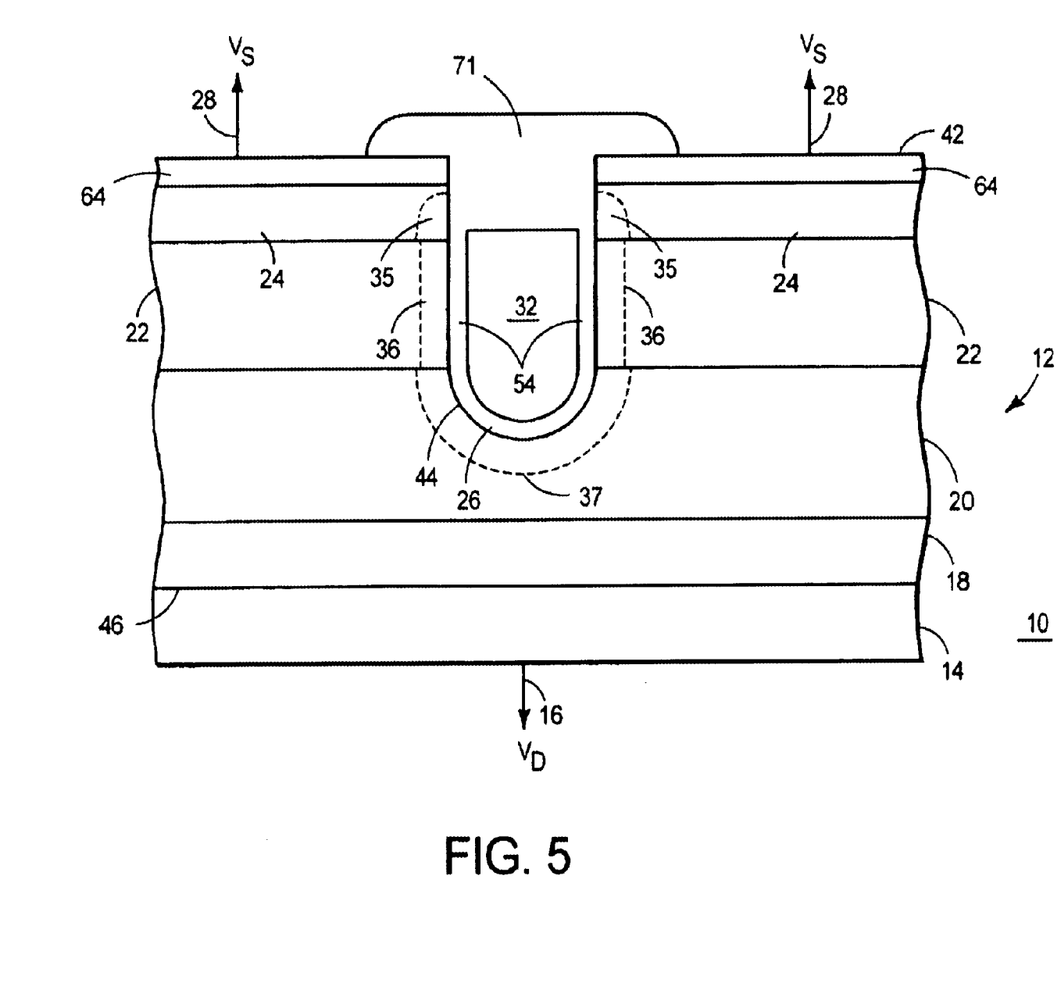
FIG. 5 shows a cross-sectional view of a bidirectional switch in a fourth embodiment.

FIG. 5 shows bidirectional switch 10 in a fourth embodiment. The structure and operation are similar to the description of the embodiment described in FIG. 3, except that no gate conductor is formed over gate electrode 32. Instead, connection from gate electrode 32 to gate lead 30 (not shown in FIG. 4) is made locally at one or more other locations on the die which are not shown. Gate electrode 32 is formed to be recessed below the level of surface 42 as shown by an amount that ensures an adequate spacing to source contact layer 64 to avoid a low breakdown voltage. Dielectric region 71 is formed over gate electrode 32 and patterned to expose source contact layer 64 for connecting to source lead 28. The embodiment of FIG. 4 has an advantage that source contact layer 64 is formed as a blanket layer whose edge is defined by trench 44, thereby eliminating an additional photomasking step.

Figure 6:
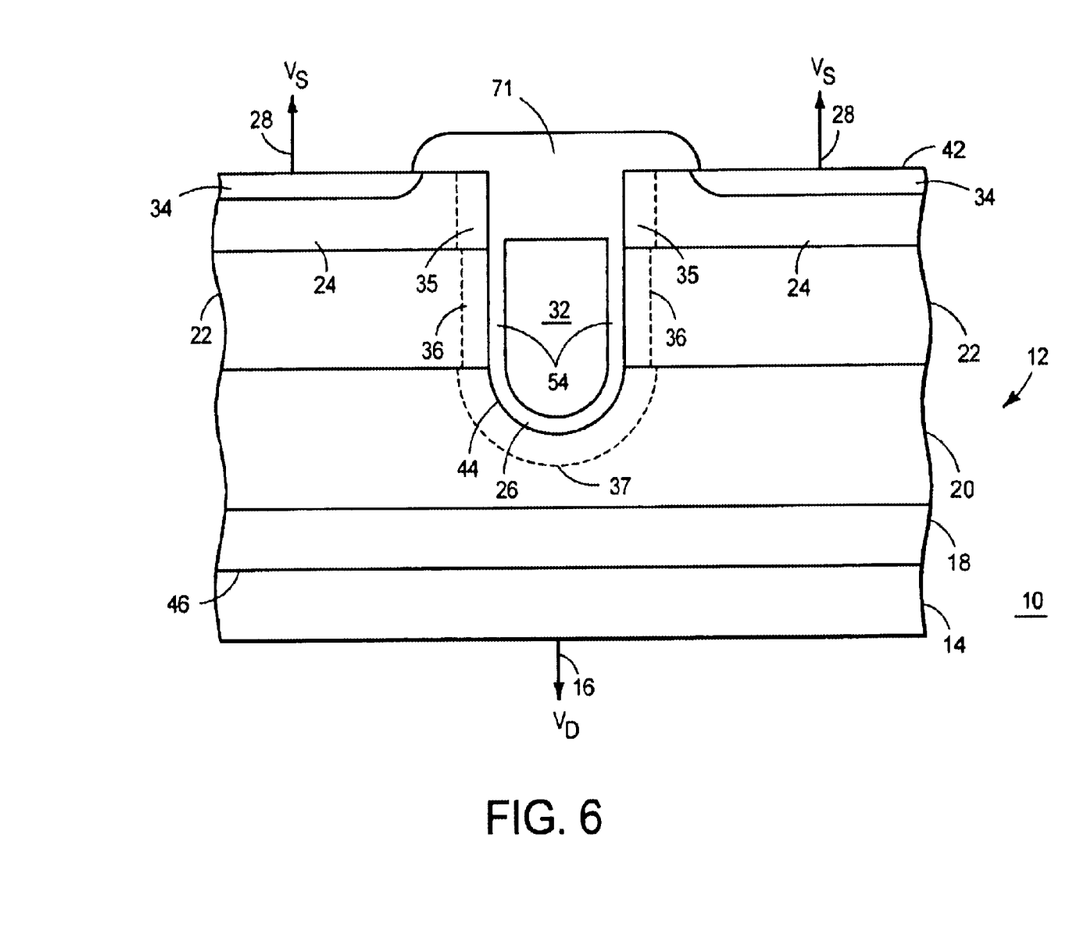
FIG. 6 shows a cross-sectional view of a bidirectional switch in a fifth embodiment.

FIG. 6 shows bidirectional switch 10 in a fifth embodiment. The structure and operation are similar to the description of the embodiment described in FIG. 1, except that gate electrode 32 does not extend to overlie surface 42. An interlayer dielectric 69 is deposited on substrate 12 and patterned to overlie gate electrode 32 as shown. Interlayer dielectric 69 functions as a mask during the introduction of impurities to form source 34, and thereby defines the distance from source 34 to gate electrode 32. This distance is at least 0.4 micrometers to prevent a breakdown at the specified voltage. Contact is made to gate electrode using vias (not shown).

Figure 7:
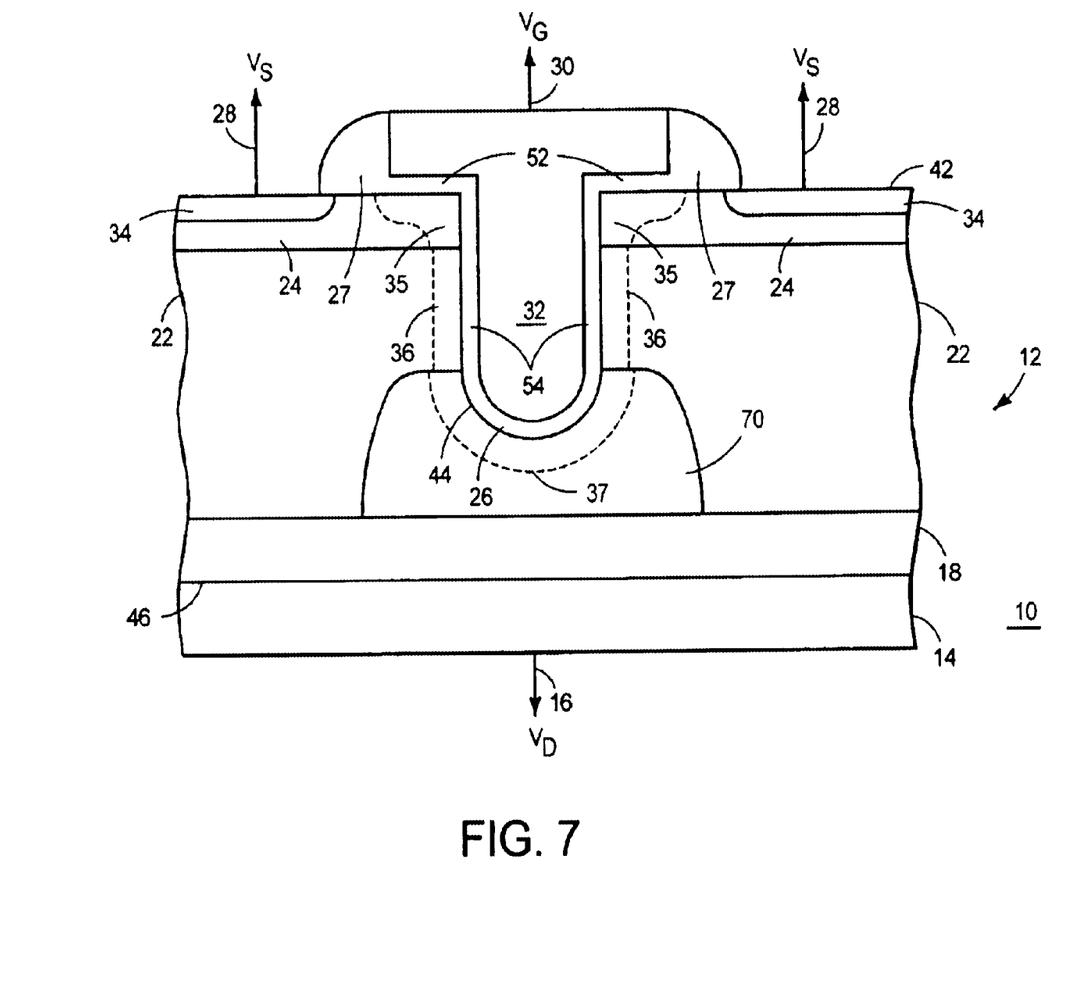
FIG. 7 shows a cross-sectional view of a bidirectional switch in a sixth embodiment.

FIG. 7 shows bidirectional switch 10 in a sixth embodiment. The structure and operation are similar to the description of the embodiment described in FIG. 1, except that drain extension 20 is replaced with a buried drain extension 70 formed with a buried layer which updiffuses into body region 22 during an epitaxial processing step to a level approximately 0.5 micrometers above the bottom of trench 44. Alternatively, dopants can be introduced at the bottom of trench 44 which diffuse down to drain 18 to form a drain extension. The doping concentration and thickness are similar to those described in FIG. 1 for drain extension 20.

By now it should be appreciated that the present invention provides a bidirectional switch that can support a high current flow while blocking high voltages applied to either conduction electrode. A semiconductor substrate has a surface in which a trench is formed. A gate activates a wall of the trench to form a conduction channel, and a conduction electrode has a first doped region for receiving a current and a second doped region for routing the current to the conduction channel. The bidirectional switch is fabricated using standard semiconductor processing and therefore has a low manufacturing cost. Moreover, the bidirectional switch is fabricated on a single semiconductor die to further reduce the cost of manufacturing and using the device. The vertical structure of the bidirectional switch has a further advantage of occupying a smaller die area than a planar device providing similar capabilities. It is understood that the present invention can be of benefit when used in embodiments not specifically described herein. For example, a p-channel bidirectional switch can be made by reversing the dopant types described above.

What is claimed is:

1. A semiconductor device, comprising:
   a semiconductor substrate having a surface for forming a trench;
   a control structure disposed for activating a wall of the trench to form a conduction channel, and having a dielectric layer along the wall and a control electrode adjacent to the dielectric layer; and
   a first conduction electrode disposed at the surface and having a first doped region spaced a predefined distance from the control structure for receiving a current, and a second doped region for routing the current to the conduction channel.

2. The semiconductor device of claim 1, wherein the semiconductor substrate has a first conductivity type and the first and second doped regions have a second conductivity type.

3. The semiconductor device of claim 2, wherein the first doped region has a higher doping concentration than the second doped region.

4. The semiconductor device of claim 1, wherein the second doped region is formed in the semiconductor substrate to underlie the first doped region.

5. The semiconductor device of claim 4, wherein the conduction channel underlies the second doped region.

6. The semiconductor device of claim 1, further comprising a second conduction electrode formed in the semiconductor substrate adjacent to a bottom portion of the trench for receiving the current flowing through the conduction channel.

7. The semiconductor device of claim 6 wherein the second conduction electrode includes a third doped region underlying the bottom portion of the trench and a fourth doped region underlying the third doped region.

8. The semiconductor device of claim 7 wherein the fourth doped region has a higher doping concentration than the third doped region.

9. The semiconductor device of claim 1, wherein the current flowing through the conduction channel is greater than one ampere.

10. The semiconductor device of claim 1, further comprising a package for mounting the semiconductor substrate.

11. The semiconductor device of claim 1, wherein the predefined distance is at least 0.4 micrometers.

12. A transistor, comprising:

a substrate having a first surface formed with a trench;

a control structure disposed for enabling a channel along a wall of the trench, and having a dielectric layer along the wall and a control electrode adjacent to the dielectric layer;

a first current carrying electrode having a first portion formed at the first surface with a first conductivity for receiving a current, and a second portion with a second conductivity for coupling the current to the channel, wherein the first portion is formed at a predefined distance from the control structure; and a second current carrying electrode formed on a second surface of the substrate for receiving the current.

13. The transistor of claim 12, wherein the second current carrying electrode includes a third portion formed adjacent to the channel to have a third conductivity and a fourth portion with a fourth conductivity for receiving the current.

14. The transistor of claim 13, wherein the third portion of the second current carrying electrode has a lower conductivity than the fourth portion.

15. The transistor of claim 12, wherein the first portion of the first current carrying electrode has a higher conductivity than the second portion.

16. The transistor of claim 12, wherein a breakdown voltage across the first and second current carrying electrodes is greater than eight volts.

* * * * *